(12) United States Patent
Yu et al.

(10) Patent No.: US 11,195,970 B2
(45) Date of Patent: Dec. 7, 2021

(54) LIGHT EMITTING DIODE PANEL AND TILING DISPLAY APPARATUS

(71) Applicant: Au Optronics Corporation, Hsinchu (TW)

(72) Inventors: Fang-Cheng Yu, Taipei (TW); Wen-Wei Yang, Changhua County (TW); Pin-Miao Liu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 105 days.

(21) Appl. No.: 16/686,211

(22) Filed: Nov. 18, 2019

(65) Prior Publication Data
US 2020/0381586 A1    Dec. 3, 2020

(30) Foreign Application Priority Data
May 29, 2019    (TW) .................................. 108118531

(51) Int. Cl.
| | | |
|---|---|---|
| H01L 33/20 | (2010.01) | |
| G09F 9/302 | (2006.01) | |
| H01L 25/075 | (2006.01) | |
| H01L 33/50 | (2010.01) | |

(52) U.S. Cl.
CPC ............ *H01L 33/20* (2013.01); *G09F 9/3026* (2013.01); *H01L 25/0753* (2013.01); *H01L 33/504* (2013.01)

(58) Field of Classification Search
None
See application file for complete search history.

(56) References Cited

U.S. PATENT DOCUMENTS

| | | | | |
|---|---|---|---|---|
| 7,279,063 | B2 * | 10/2007 | Yokajty | ............... H01L 51/5246 |
| | | | | 156/275.5 |
| 2013/0057944 | A1 * | 3/2013 | Kim | ................... G02F 1/16761 |
| | | | | 359/296 |
| 2015/0124188 | A1 * | 5/2015 | Kadowaki | ......... G02F 1/133514 |
| | | | | 349/42 |

FOREIGN PATENT DOCUMENTS

| | | |
|---|---|---|
| CN | 101556425 | 10/2009 |
| CN | 101866912 | 10/2010 |
| CN | 102339565 | 2/2012 |
| CN | 102496356 | 6/2012 |

* cited by examiner

*Primary Examiner* — Bo B Jang
(74) *Attorney, Agent, or Firm* — JCIPRNET

(57) ABSTRACT

An LED panel including a substrate, multiple first pixels, multiple second pixels, multiple first protrusion structures and second protrusion structures is provided. The first pixels and second pixels each disposed in a display area of the substrate has at least one light emitting element. The second pixels are positioned on at least one display edge of the display area and positioned between the first pixels and a substrate edge. Each first protrusion structure is positioned on the periphery of the at least one light emitting element of one corresponding first pixel. Each second protrusion structure is positioned on the periphery of the at least one light emitting element of one corresponding second pixel. The orthogonal projection contour of each first protrusion structure on the substrate is different from that of each second protrusion structure on the substrate. A tiling display apparatus adopting the light emitting diode panel is also provided.

20 Claims, 9 Drawing Sheets

LIGHT EMITTING DIODE PANEL AND TILING DISPLAY APPARATUS

CROSS-REFERENCE TO RELATED APPLICATION

This application claims the priority benefit of Taiwan application serial no. 108118531, filed on May 29, 2019. The entirety of the above-mentioned patent application is hereby incorporated by reference herein and made a part of this specification.

BACKGROUND

Technical Field

The present disclosure relates to a display panel and a display apparatus, and more particularly to a light emitting diode panel and a tiling display apparatus.

Description of Related Art

As the application of display apparatus becomes more diversified, the use of large display billboards for displaying public information or advertisements is becoming more and more popular in major exhibition halls or department stores. In order to reduce the setup and maintenance cost of large display billboards, tiling displays constituting multiple display panels have become one of the common configuration for such large display billboards. In general, a display panel of a tiling display (such as a liquid crystal display panel or a light-emitting diode panel) has a non-pattern area located at the periphery of the display area, and these non-pattern areas adjacent to the tiling area of two display panels very often cause visual image discontinuity (such as a dark line) in the display frame of the tiling display.

In order to eliminate the above image discontinuity, the LED panel has gained more attention because of its narrow frame width. Although the LED panel does not need to be provided with a sealant for sealing the liquid crystal on the periphery like the liquid crystal display panel, a certain space is reserved around the panel to meet the process requirements, and the reserved space still causes visual image discontinuity on the display frame of the tiling display. Therefore, how to solve the above problems is one of the issues that the relevant manufacturers need to confront with in the process of developing the tiling display technology.

SUMMARY

The disclosure provides a light-emitting diode (LED) panel of which the non-pattern area has low visibility.

The disclosure provides a tiling display apparatus, which has good display quality and is cost effective.

The LED panel of the present disclosure includes a substrate, a plurality of first pixels, a plurality of second pixels, a plurality of first protrusion structures and a plurality of second protrusion structures. The substrate has a display area and a substrate edge. The plurality of first pixels and the plurality of second pixels are disposed in the display area, and each has at least one light-emitting element. The plurality of second pixels are located on at least one display edge of the display area, and the plurality of second pixels are located between the plurality of first pixels and the substrate edge. The plurality of first protrusion structures and the plurality of second protrusion structures are disposed on the substrate. Each of the first protrusion structures is located at a periphery of the at least one light-emitting element of one corresponding first pixel, and each of the second protrusion structures is located at a periphery of the at least one light-emitting element of one corresponding second pixel. The at least one light-emitting element of each of the second pixels is located between one corresponding second protrusion structure and one corresponding display edge, and the orthogonal projection contour of each of the first protrusion structures on the substrate is different from the orthogonal projection contour of each of the second protrusion structures on the substrate.

The tiling display apparatus of the present disclosure includes a first LED panel and a second LED panel. The first LED panel and the second LED panel each include a substrate, a plurality of first pixels, a plurality of second pixels, a plurality of first protrusion structures, and a plurality of second protrusion structures. The substrate has a display area. The plurality of first pixels and the plurality of second pixels are disposed in the display area, and each has at least one light-emitting element. The plurality of second pixels are located at a display edge of the display area, and the plurality of first pixels are located on one side of the plurality of second pixels away from the display edge. The plurality of first protrusion structures and the plurality of second protrusion structures are disposed on the substrate, and each of the first protrusion structures is located at a periphery of the at least one light-emitting element of one corresponding first pixel, and each of the second protrusion structures is located at a periphery of the at least one light-emitting element of one corresponding second pixel. The at least one light-emitting element of each of the second pixels is located between one corresponding second protrusion structure and the display edge, and the orthogonal projection contour of each of the first protrusion structures on the substrate is different from the orthogonal projection contour of each of the second protrusion structures on the substrate. The display edge of the first LED panel is spliced to the display edge of the second LED panel in a first direction, and the plurality of second pixels of the first LED panel and the plurality of second pixels of the second LED panel constitute a plurality of tiling pixels. The at least two light-emitting elements of each tiling pixel are located between one corresponding second protrusion structure of the first LED panel and one corresponding second protrusion structure of the second LED panel.

Based on the above, in the LED panel of the embodiment of the present disclosure, a plurality of second pixels are disposed between the display edge on at least one side for splicing and the plurality of first pixels, and the peripheries of each of the first pixels and each of the second pixels are respectively provided with two protrusion structures, and the two protrusion structures respectively have different orthogonal projection contours on the substrate, which can reduce the visibility of the non-pattern area of the LED panel. In addition, in the tiling display apparatus in an embodiment of the present disclosure, by splicing together the two display edges having the plurality of second pixels of each of the two LED panels and constituting the plurality of tiling pixels, and the tiling pixels are respectively disposed between two corresponding second protrusion structures, it is possible to enhance the overall light uniformity of the tiling display apparatus, thereby effectively suppressing the image discontinuity generated on the display frame by the tiling area of the two LED panels.

To make the aforementioned more comprehensible, several embodiments accompanied with drawings are described in detail as follows.

DESCRIPTION OF THE EMBODIMENTS

Figure 1:
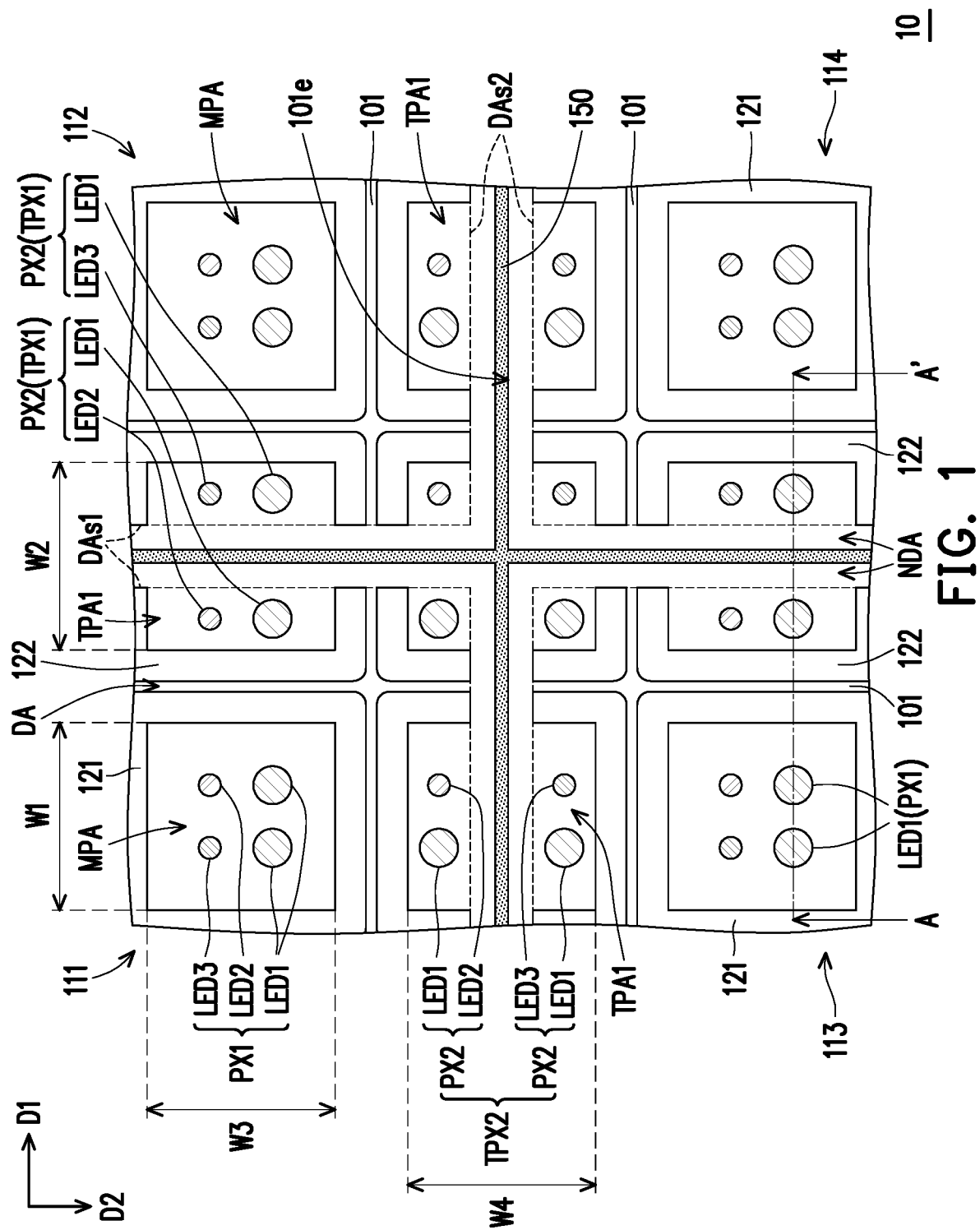
FIG. 1 is a schematic top view of a tiling display apparatus according to a first embodiment of the present disclosure.

The terms used herein such as "about", "approximate", or "substantial" include a related value and an average within an acceptable deviation range of specific values determined by those with ordinary skills in the art with consideration of discussed measurement and a specific number of errors related to the measurement (i.e., a limitation of a measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about", "approximately", or "substantially" as used herein based on optical properties, etching properties or other properties, instead of applying one standard deviation across all the properties.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected (or coupled). Therefore, the electrical connection (or coupling) between two devices may include intervening elements existing between the two devices.

Further, relative terms such as "lower" or "bottom" and "upper" or "top" may be used herein for ease of description to describe one element's relationship to another element as shown in the figures. It will be understood that relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. Similarly, if the device in the figures is turned over, an element described as being "below" or "lower" relative to another element will then be "above" or "upper" relative to the other element. Thus, the term "below" encompasses both the below and above orientations depending on the spatial orientation of the device.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the disclosure should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the disclosure.

Reference will now be made in detail to the exemplary embodiments, and implementation of the exemplary embodiments are illustrated in the drawings. Wherever possible, the same element symbols denote the same or similar parts in the drawings and descriptions.

Figure 2:
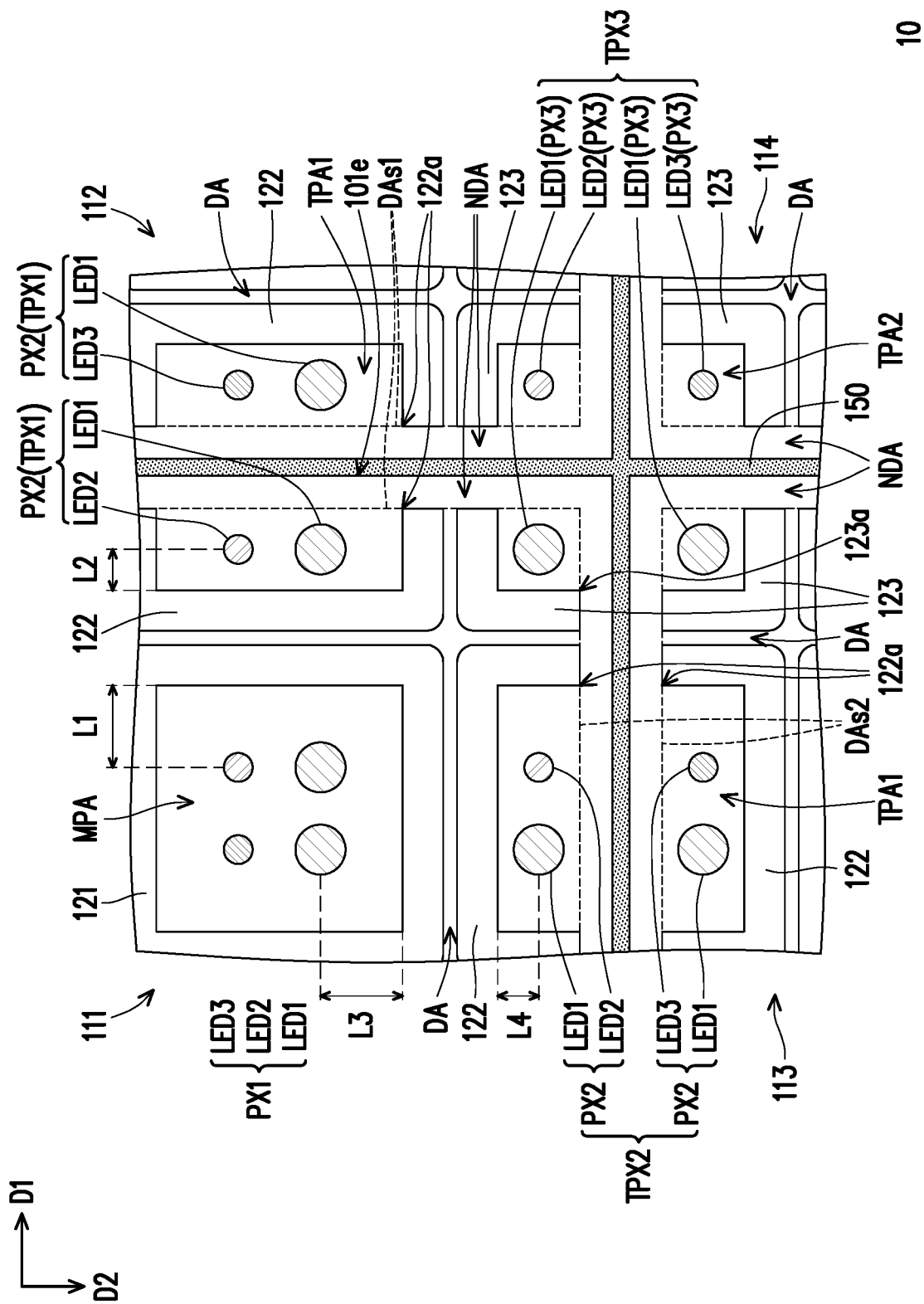
FIG. 2 is a schematic enlargement view of a partial area of the tiling display apparatus in FIG. 1.
Figure 3:
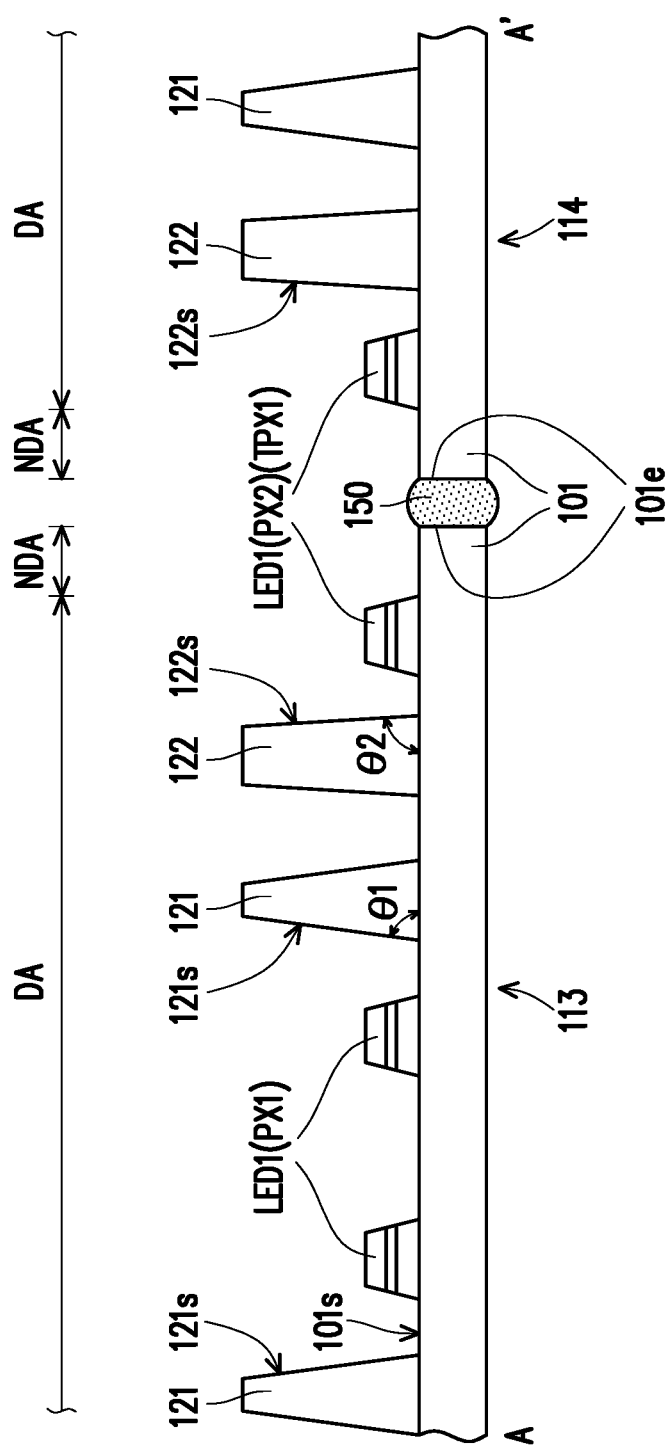
FIG. 3 is a schematic cross-sectional view of the tiling display apparatus of FIG. 1.

FIG. 1 is a schematic top view of a tiling display apparatus according to a first embodiment of the present disclosure. FIG. 2 is a schematic enlargement view of a partial area of the tiling display apparatus in FIG. 1. FIG. 3 is a schematic cross-sectional view of the tiling display apparatus of FIG. 1. It should be noted that FIG. 3 corresponds to the cross-sectional line A-A' of FIG. 1. Referring to FIG. 1 and FIG. 2, a tiling display apparatus 10 includes a first light-emitting diode (LED) panel 111, a second LED panel 112, a third LED panel 113, and a fourth LED panel 114. The first LED panel 111 and the third LED panel 113 are respectively spliced to the second LED panel 112 and the fourth LED panel 114 in the first direction D1, and the first LED 111 and the second LED panel 112 are respectively spliced to the third LED panel 113 and the fourth LED panel 114 in the second direction D2. That is, the tiling display apparatus 10 is formed by splicing a plurality of LED panels.

In this embodiment, the number of the spliced LED panel is exemplified as four for exemplary purpose, but the disclosure is not limited thereto. According to other embodiments, the number of the spliced LED panel can also be adjusted according to the size requirement of the tiling display apparatus, for example, two, three, or five or more. In this embodiment, the LED panel is, for example, a Micro Light-Emitting Diode (Micro LED) panel, but the disclosure is not limited thereto. In other embodiments, the LED panel can also be a Mini Light-Emitting Diode (Mini LED) panel.

On the other hand, the tiling display apparatus 10 further includes a joint structure 150. The joint structure 150 is located between any two adjacent LED panels, and connects the first LED panel 111, the second LED panel 112, the third LED panel 113 and the fourth LED panel 114. In this embodiment, the joint structure 150 is, for example, an adhesive layer, and the material of the adhesive layer includes, for example, Optical Clear Resin (OCR), Optical Clear Adhesive (OCA), Pressure Sensitive Adhesive (PSA), or other suitable adhesive. However, the present disclosure is not limited thereto. In other embodiments, the joint structure 150 may also be a mechanism design suitable for fixing the relative positions of the plurality of LED panels.

Further, the first LED panel 111, the second LED panel 112, the third LED panel 113, and the fourth LED panel 114 of the tiling display apparatus 10 each include a substrate 101, a plurality of first pixels PX1 and a plurality of second pixels PX2. The substrate 101 has a substrate edge 101e, a display area DA, and a non-pattern area NDA surrounding the display area DA, and the first pixels PX1 and the second pixels PX2 are disposed in the display area DA of the substrate 101. In this embodiment, the display area DA has the first display edge DAs1 and the second display edge DAs2 connected to each other. The first display edge DAs1 and the second display edge DAs2 respectively extend in the second direction D2 and the first direction D1, and the first direction D1 intersects with the second direction D2.

Further to the above, the second pixels PX2 of the LED panel are disposed on the first display edge DAs1 and the second display edge DAs2 of the display area DA, and the second pixels PX2 are located between the first pixels PX1 and the substrate edges 101e. However, the present disclosure is not limited thereto. In other embodiments, the two display edges having the plurality of second pixels PX2 of the display area DA may also be located on opposite sides (i.e., the extending directions of the two display edges are parallel to each other) of the display area DA, such that the plurality of LED panels can be spliced to each other in an extending direction substantially perpendicular to the two display edges. In other embodiments, the plurality of second pixels PX2 of the LED panel may be disposed around the plurality of first pixels PX1, such that the display edges of the display area DA are all suitable for splicing to increase the splicing freedom of the LED panel. In still other embodiments, the plurality of second pixels PX2 of the LED panel may only be disposed on one side of the display area DA for splicing two LED panels together.

In this embodiment, the first LED panel 111 and the second LED panel 112 (or the third LED panel 113 and the fourth LED panel 114) are respectively spliced to each other through one side provided with the first display edge DAs1, and the first LED panel 111 and the third LED panel 113 (or the second LED panel 112 and the fourth LED panel 114) are respectively spliced to each other through one side provided with the second display edge DAs2. In detail, the plurality of second pixels PX2 of each of any two adjacent LED panels (for example, the first LED panel 111 and the second LED panel 112, the first LED panel 111 and the third LED panel 113, the second LED panel 112 and the fourth LED panel 114, or the third LED panel 113 and the fourth LED panel 114) are located on opposite sides of the joint structure 150, and the second pixels PX2 can be spliced into multiple tiling pixels.

From another point of view, these tiling pixels respectively cross the tiling area of the corresponding two adjacent LED panels. That is, in the normal direction of the substrate 101, the tiling pixels of the tiling display apparatus 10 are respectively overlapped with the joint structure 150 of any two adjacent LED panels. It is worth mentioning that the tiling pixels and the plurality of first pixels PX1 of the tiling display apparatus 10 substantially exhibit similar configuration and configuration relationship. That is, one of the two second pixels PX2 constituting one tiling pixel may present a part of the first pixel PX1, and the other of the two second pixels PX2 may present the other part of the first pixel PX1.

For example, the second pixel PX2 of the first LED panel 111 at the first display edge DAs1 and the second pixel PX2 of the second LED panel 112 at the first display edge DAs1 may constitute a tiling pixel TPX1 in the direction D1. The second pixel PX2 of the first LED panel 111 at the second display edge DAs2 and the second pixel PX2 of the third LED panel 113 at the second display edge DAs2 may constitute another tiling pixel TPX2 in the direction D2. Likewise, the fourth LED panel 114 and the second LED panel 112 or the fourth LED panel 114 and the third LED panel 113 can be spliced into multiple tiling pixels in a similar manner, so no repetition is incorporated herein.

Referring to FIG. 2, in the embodiment, each of the LED panels of the tiling display apparatus 10 may further include a third pixel PX3. The third pixel PX3 is disposed in the display area DA and located at a boundary between the first display edge DAs1 and the second display edge DAs2. In this embodiment, the extending direction (i.e., the second direction D2) of the first display edge DAs1 may be selectively perpendicular to the extending direction (i.e., the first direction D1) of the second display edge DAs2, but the present disclosure is not limited thereto. Specifically, the four pixels PX3 of the first LED panel 111, the second LED panel 112, the third LED panel 113, and the fourth LED panel 114 of the tiling display apparatus 10 may be spliced into one tiling pixel TPX3. However, the present disclosure is not limited thereto, and in other embodiments, the LED panel may not have the third pixel PX3.

Further, the plurality of first pixels PX1, the plurality of second pixels PX2 and the third pixel PX3 of the LED panel each have at least one light-emitting element, and the number of light-emitting elements of the first pixel PX1 of the LED panel is larger than the number of light-emitting elements of the second pixel PX2 and the number of light-emitting elements of the third pixel PX3. In this embodiment, the number of light-emitting elements of the first pixel PX1 and the second pixel PX2 of the LED panel are exemplarily illustrated as four and two, respectively. That is, in the present embodiment, the number of light-emitting elements of the first pixel PX1, the tiling pixel TPX1, the tiling pixel TPX2, and the tiling pixel TPX3 may be selectively equal, and the number of the light-emitting elements of the first pixel PX1 and the number of light-emitting elements of the tiling pixel are even numbers. However, the present disclosure is not limited thereto. In other embodiments, the number of light-emitting elements of the first pixel PX1 of the LED panel may also be one, two, three, or five or more, and the number of light-emitting elements of the second pixel PX2 can also be one, or three or more. On the other hand, in the embodiment, the number of light-emitting elements of the third pixel PX3 of the LED panel is exemplarily illustrated as one. However, the present disclosure is not limited thereto, and in other embodiments, the number of light-emitting elements of the third pixel PX3 of the LED panel may be two or more.

For example, the four light-emitting elements of the first pixel PX1 may be two first light-emitting elements LED1, one second light-emitting element LED2, and one third light-emitting element LED3, and the two light-emitting elements of the second pixel PX2 may be any one of the second light-emitting element LED2 and the third light-emitting element LED3 and one first light-emitting element LED1, and one light-emitting element of the third pixel PX3 may be any one of the first light-emitting element LED1, the second light-emitting element LED2, and the third light-emitting element LED3. Specifically, the first light-emitting element LED1, the second light-emitting element LED2, and the third light-emitting element LED3 may be configured to respectively display different colors, such as red, green, and blue. That is, the luminous colors of the first light-emitting element LED1, the second light-emitting element LED2, and the third light-emitting element LED3 are different.

In order to make the first pixel PX1, the tiling pixel TPX1, the tiling pixel TPX2 and the tiling pixel TPX3 have similar optical performance, the number of one of the first light-emitting element LED1, the second light-emitting element LED2, and the third light-emitting element LED3 (for example, the first light-emitting element LED1) of each of the first pixel PX1, the tiling pixel TPX1, the tiling pixel TPX2 and the tiling pixel TPX3 is two or more. That is, at least two of the second pixel PX2 and the plurality of (for example, four) third pixels PX3 each need to have at least one light-emitting element (for example, first light-emitting element LED1) having the same luminous color as the plurality of light-emitting elements of the first pixel PX1. In this embodiment, the luminous color of the plurality of (for example, two) first light-emitting elements LED1 may be green with high light sensitivity for human eye or red with poor luminous efficiency.

In this embodiment, to avoid that the display brightness of the tiling pixel TPX1, the tiling pixel TPX2 and the tiling pixel TPX3 is different from the display brightness of the first pixel PX1 due to poor reflection characteristics of the adjacent joint structure 150 (for example, the adhesive layer) or the splicing error between two LED panels, the luminous brightness of the light-emitting elements of each of the second pixel PX2 and the third pixel PX3 may be selectively greater than the luminous brightness of the light-emitting element of the first pixel PX1. However, the disclosure is not limited thereto. In other embodiments, the luminous brightness of the light-emitting elements of each of the second pixel PX2 and the third pixel PX3 may also be equal to the luminous brightness of the light-emitting element of the first pixel PX1.

For example, it may be configured that the driving current of the light-emitting element of the second pixel PX2 (or the third pixel PX3) is greater than the driving current of the light-emitting element of the first pixel PX1, such that the luminous brightness of the light-emitting element of the second pixel PX2 (or the third pixel PX3) is greater than the luminous brightness of the light-emitting element of the first pixel PX1. However, the present disclosure is not limited thereto. According to other embodiments, it may be configured that the luminous area of the light-emitting element of the second pixel PX2 (or the third pixel PX3) is larger than the luminous area of the light-emitting element of the first pixel PX1, thereby achieving the configuration relationship in which the luminous brightness of the light-emitting element of the second pixel PX2 (or the third pixel PX3) is greater than the luminous brightness of the light-emitting element of the first pixel PX1.

Further, the first LED panel 111, the second LED panel 112, the third LED panel 113, and the fourth LED panel 114 of the tiling display apparatus 10 each further include a plurality of first protrusion structures 121 and a plurality of second protrusion structures 122 disposed on the substrate 101. The first protrusion structures 121 of the LED panel are respectively located at the periphery of the at least one light-emitting element of the plurality of first pixels PX1, and the second protrusion structures 122 of the LED panel are respectively located at the periphery of the at least one light-emitting element of the plurality of second pixels PX2 (or the plurality of tiling pixels TPX1 and the plurality of tiling pixels TPX2).

From another point of view, the plurality of first protrusion structures 121 of the first LED panel 111, the second LED panel 112, the third LED panel 113, and the fourth LED panel 114 may define a plurality of main pixel areas MPA of the tiling display apparatus 10, and the main pixel areas MPA are respectively provided with the plurality of first pixels PX1 of the plurality of LED panels. Specifically, the light-emitting elements of the first pixel PX1 may be surrounded by the corresponding first protrusion structure 121. On the other hand, the plurality of second protrusion structures 122 of the first LED panel 111, the second LED panel 112, the third LED panel 113, and the fourth LED panel 114 may define a plurality of tiling pixel areas TPA1 of the tiling display apparatus 10, and the tiling pixel areas TPA1 are respectively provided with the plurality of tiling pixels TPX1 and the plurality of tiling pixels TPX2 (or a plurality of second pixels PX2 of a plurality of LED panels).

In the present embodiment, the main pixel area MPA provided with the first pixel PX1 has a first width W1 in the first direction D1, and the tiling pixel area TPA1 provided with the tiling pixel TPX1 has a second width W2 in the first direction D1, and the second width W2 may be equal to the first width W1. Similarly, the main pixel area MPA provided with the first pixel PX1 has a third width W3 in the second direction D2, and the tiling pixel area TPA1 provided with the tiling pixel TPX2 has a fourth width W4 in the second direction D2, and the fourth width W4 may be equal to the third width W3, but the disclosure is not limited thereto.

Further, the orthogonal projection contour of the first protrusion structure 121 on the substrate 101 is different from the orthogonal projection contour of the second protrusion structure 122 on the substrate 101. For example, the orthogonal projection of each of the plurality of second protrusion structures 122 of the LED panel (e.g., the first LED panel 111 to the fourth LED panel 114) on the substrate 101 has an opening 122a (that is, the orthogonal projection contour of the second protrusion structure 122 on the substrate 101 is substantially U-shaped) facing the corresponding display edge (for example, the first display edge DAs1 or the second display edge DAs2). That is, the light-emitting element of each of the two second pixels PX2 located in a tiling pixel area is located between the corresponding second protrusion structure 122 and the corresponding display edge, and with the opening 122a of the second protrusion structures 122, the beam emitted by the light-emitting element of each of the plurality of tiling pixels is concentrated toward the non-pattern area NDA (that is, the light pattern of the light-emitting element of each of the plurality of tiling pixels is adjusted). In this manner, the visibility of the non-pattern area NDA of the LED panel can be reduced.

In this embodiment, the plurality of openings 122a of the plurality of second protrusion structures 122 of the first LED panel 111 located at the first display edge DAs1 and the plurality of openings 122a of the plurality of second protrusion structures 122 of the second LED panel 112 located at the first display edge DAs1 are disposed opposite to each other. The plurality of openings 122a of the plurality of second protrusion structures 122 of the first LED panel 111 located at the second display edge DAs2 and the plurality of openings 122a of the plurality of second protrusion structures 122 of the third LED panel 113 located at the second display edge DAs2 are disposed opposite to each other. Likewise, the arrangement relationship of the plurality of openings 122a of the plurality of second protrusion structures 122 of the fourth LED panel 114 and the second LED panel 112 or the arrangement relationship of the plurality of openings 122a of the plurality of second protrusion structures 122 of the fourth LED panel 114 and the third LED panel 113 can also be implemented in the above manner, and thus will not be described again.

From another point of view, the four light-emitting elements of the tiling pixel TPX1 of the tiling display apparatus 10 located between the first LED panel 111 and the second LED panel 112 are located between one corresponding second protrusion structure 122 of the first LED panel 111 and the corresponding second protrusion structure 122 of the second LED panel 112. Likewise, the configuration relationship of the four light-emitting elements of the tiling pixel TPX1 of the tiling display apparatus 10 located between the third LED panel 113 and the fourth LED panel 114 and the configuration relationship of the four light-emitting elements of the tiling pixel TPX2 of the tiling display apparatus 10 located between the first LED panel 111 and the third LED panel 113 (or the second LED panel 112 and the fourth LED panel 114) may be implemented in the manner described above, and thus no repetition is incorporated herein.

In this embodiment, through the configuration relationship of the plurality of openings 122a of the plurality of second protrusion structures 122, the light beams emitted by the light-emitting elements of each of the plurality of tiling pixels TPX1 can be concentrated toward the tiling area (or the position of the joint structure 150) of the first LED panel 111 and the second LED panel 112 (or the third LED panel 113 and the fourth LED panel 114) as well as the two non-pattern areas NDA (that is, the light pattern of the light-emitting elements of each of the plurality of tiling pixels can be adjusted) located on opposite sides of the tiling area. Similarly, the light beams emitted by the light-emitting elements of each of the plurality of tiling pixels TPX2 can be concentrated toward the tiling area (or the position of the joint structure 150) of the first LED panel 111 and the third LED panel 113 (or the second LED panel 112 and the fourth LED panel 114) as well as the two non-pattern areas NDA (that is, the light pattern of the light-emitting element of each of the plurality of tiling pixels can be adjusted) located on opposite sides of the tiling area. In this manner, it is possible to enhance the overall light uniformity of the tiling display apparatus 10, thereby effectively suppressing the image discontinuity generated on the display frame in the tiling area of the two LED panels.

Further, each of the first LED panel 111, the second LED panel 112, the third LED panel 113, and the fourth LED panel 114 of the tiling display apparatus 10 may further include a plurality of third protrusion structures 123 disposed on the substrate 101. The third protrusion structures 123 of the LED panel are respectively located at the periphery of the light-emitting elements of each of the plurality of third pixels PX3. Specifically, at least one light-emitting element of the third pixel PX3 of the LED panel is located between the first display edge DAs1, the second display edge DAs2 and the third protrusion structure 123.

Specifically, the orthogonal projection contour of the third protrusion structure 123 on the substrate 101 is different from the orthogonal projection contour of each of the first protrusion structure 121 and the second protrusion structure 122 on the substrate 101. For example, the orthogonal projection of the third protrusion structure 123 on the substrate 101 has an opening 123a facing the first display edge DAs1 and the second display edge DAs2. More specifically, the orthogonal projection contour of the third protrusion structure 123 on the substrate 101 is substantially L-shaped.

In this embodiment, the openings 123a of the third protrusion structures 123 of each of the first LED panel 111, the second LED panel 112, the third LED panel 113, and the fourth LED panel 114 of the tiling display apparatus 10 all face a boundary of the four LED panels (i.e., an intersection where a portion of the joint structure 150 extending in the first direction D1 intersects with another portion of the joint structure 150 extending in the second direction D2). From another point of view, the fourth third protrusion structures 123 of the first LED panel 111, the second LED panel 112, the third LED panel 113, and the fourth LED panel 114 can define a tiling pixel area TPA2 of the tiling display apparatus 10, and the tiling pixel area TPA2 is provided with a tiling pixel TPX3 (or four third pixels PX3 of four LED panels).

Through the configuration that the four light-emitting elements of the tiling pixel TPX3 are respectively located between a corresponding third protrusion structure 123 and the joint structure 150, the light beam emitted by the four light-emitting elements of the tiling pixel TPX3 can be concentrated toward the tiling area of the four LED panels and four non-pattern areas NDA adjacent to the tiling area (that is, the light pattern of the light-emitting element of the tiling pixel TPX3 can be adjusted). In this manner, the visibility of the tiling area and the non-pattern area NDA between the four LED panels can be reduced, which helps to improve the overall light uniformity of the tiling display apparatus 10, thereby effectively suppressing the image discontinuity generated on the display frame by the tiling area of the four LED panels.

Specifically, in the present embodiment, the shapes of the main pixel area MPA of the first pixel PX1 (i.e., the area surrounded by the first protrusion structure 121), the tiling pixel area TPA1 provided with the tiling pixel TPX1 (i.e., the area surrounded by the two second protrusion structures 122), the tiling pixel area TPA1 provided with the tiling pixel TPX2 (i.e., the area surrounded by the two second protrusion structures 122), and the tiling pixel area TPA2 provided with the tiling pixel TPX3 (the area surrounded by the four third protrusion structures 123) may be substantially the same (for example, all squares), but the disclosure is not limited thereto.

In this embodiment, there is the shortest distance L1 between the light-emitting element (for example, the second light-emitting element 112) of the first pixel PX1 and the corresponding first protrusion structure 121 in the first direction D1, and there is the shortest distance L2 between the light-emitting element (for example, the second light-emitting element 112) of the second pixel PX2 and the corresponding second protrusion structure 122 in the first direction D1, and the distance L2 is smaller than the distance L1. Similarly, there is the shortest distance L3 between the light-emitting element (for example, the first light-emitting element 111) of the first pixel PX1 and the corresponding first protrusion structure 121 in the second direction D2, and there is the shortest distance L4 between the light-emitting element (for example, the first light-emitting element 111) of the second pixel PX2 and the corresponding second protrusion structure 122 in the second direction D2, and the distance L4 is smaller than the distance L3. In this way, the light collecting effect of the second protrusion structure 122 can be improved, and the light collecting uniformity of the protrusion structure (for example, the first protrusion structure 121 and the second protrusion structure 122) for the light-emitting element can be enhanced.

Referring to FIG. 3, the first protrusion structure 121 has a first side surface 121s facing the light-emitting element of the corresponding first pixel PX1, and the second protrusion structure 122 has a second side surface 122s facing the light-emitting element of the corresponding second pixel PX2, wherein the first protrusion structure 121 has a first inner angle θ1 between the first side surface 121s and the surface 101s of the substrate 101, and the second protrusion structure 122 has a second inner angle θ2 between the second side surface 122s and the surface 101s of the substrate 101. In this embodiment, the second inner angle θ2 of the second protrusion structure 122 may be selectively larger than the first inner angle θ1 of the first protrusion structure 121. In this manner, the light beam emitted by the light-emitting elements of the tiling pixels (for example, tiling pixel TPX1 and tiling pixel TPX2) can be concentrated toward the tiling area between the two LED panels and the non-pattern area NDA on the opposite sides of the tiling area, thereby further reducing the visibility of the tiling area and the non-pattern area NDA between the two LED panels, and effectively suppressing the image discontinuity generated by the non-pattern area NDA of the LED panel on the display frame. In some embodiments, the first inner angle θ1 and the second inner angle θ2 may be between 40 degrees and 80 degrees, and under the condition that the second inner angle θ2 is larger than the first inner angle θ1, the difference between the second inner angle θ2 and the first inner angle θ1 may be between 10 degrees and 15 degrees. However, the present disclosure is not limited thereto, and in other embodiments, the second inner angle θ2 of the second protrusion structure 122 may also be equal to the first inner angle θ1 of the first protrusion structure 121.

For example, the visible light reflective index of the first protrusion structure 121 and the second protrusion structure 122 is larger than or equal to 50%. In this embodiment, the light-emitting element is, for example, a vertical-type light-emitting diode, but the disclosure is not limited thereto. In other embodiments, the light-emitting element may also be a lateral-type light-emitting diode or a flip-chip type light-emitting diode.

In the following, other embodiments will be described to explain the present disclosure in detail, in which the same components will be denoted by the same symbols, and the description of the same technical content will be omitted. For the omitted part, please refer to the foregoing embodiments, and related details are not described below.

Figure 4:
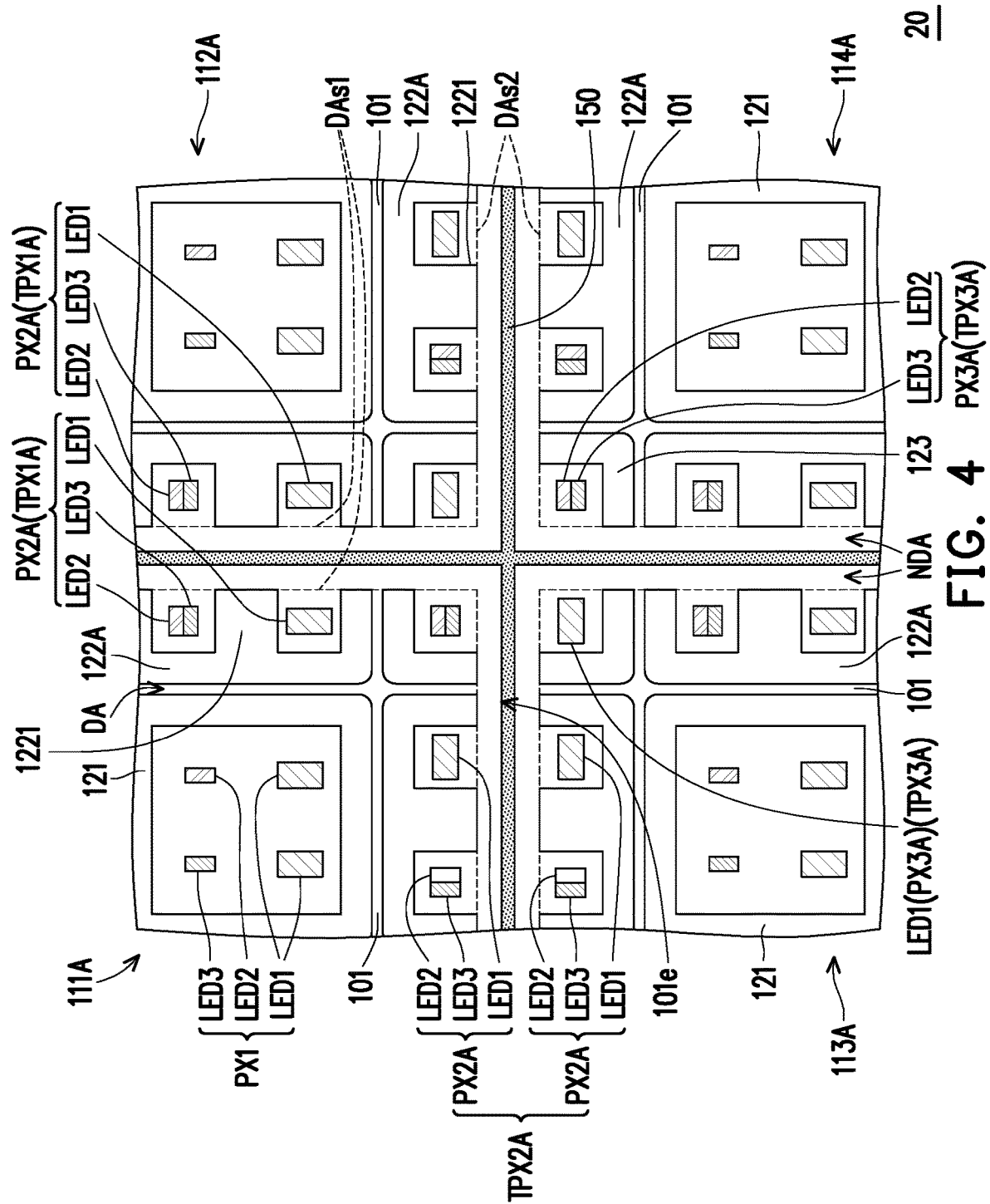
FIG. 4 is a schematic top view of a tiling display apparatus according to a second embodiment of the present disclosure.

FIG. 4 is a schematic top view of a tiling display apparatus according to a second embodiment of the present disclosure. Referring to FIG. 4, the main difference between the tiling display apparatus 20 of the present embodiment and the tiling display apparatus 10 of FIG. 1 is that the number of light-emitting elements of the second pixel PX2 and the third pixel PX3 are different and the configuration of the second protrusion structure is different. In this embodiment, the number of the light-emitting elements of the second pixel PX2 is three, which are the first light-emitting element LED1, the second light-emitting element LED2, and the third light-emitting element LED3, respectively, and the number of the light-emitting elements of the two third pixels PX3A is two, which are the second light-emitting element LED2 and the third light-emitting element LED3, respectively. Therefore, the number of light-emitting elements of each of the tiling pixel TPX1A, the tiling pixel TPX2A, and the tiling pixel TPX3A of the tiling display apparatus 20 is six. That is, in the present embodiment, the number of light-emitting elements of each of the tiling pixel TPX1A, the tiling pixel TPX2A, and the tiling pixel TPX3A may be selectively larger than the number of light-emitting elements of the first pixel PX1, but the present disclosure is not limited thereto.

On the other hand, the second protrusion structure 122A of the LED panel (for example, the first LED panel 111A to the fourth LED panel 114A) has a protrusion portion 1221, and the protrusion portion 1221 is located between the first light-emitting element LED1 and the second light-emitting element LED2 (or the third light-emitting element LED3) of the corresponding second pixel PX2. In this embodiment, the number of the protrusion portion 1221 of the second protrusion structure 122A is exemplarily illustrated as one, which does not indicate that the present disclosure is limited by the disclosure of the drawings. In other embodiments, the number of protrusion portion 1221 can also be adjusted according to actual optical requirements. By disposing the protrusion portion 1221 of the second protrusion structure 122A between the two light-emitting elements of the corresponding second pixel PX2A, the light pattern of the light-emitting element can be further adjusted, thereby facilitating to improve light uniformity of the tiling display apparatus 20 in the tiling area and the non-pattern area NDA.

Figure 5:
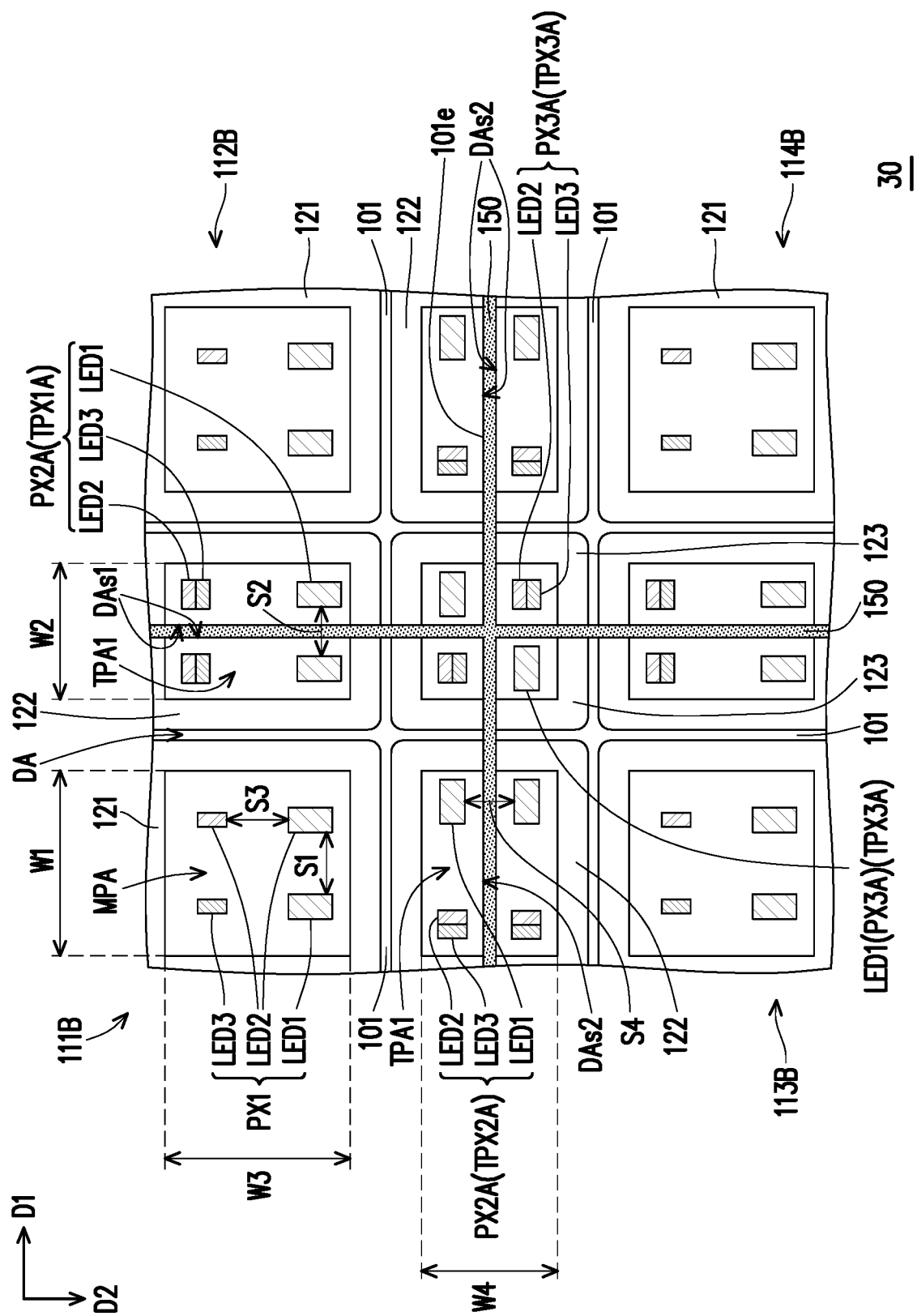
FIG. 5 is a schematic top view of a tiling display apparatus according to a third embodiment of the present disclosure.

FIG. 5 is a schematic top view of a tiling display apparatus according to a third embodiment of the present disclosure. Referring to FIG. 5, the main difference between the tiling display apparatus 30 of the present embodiment and the tiling display apparatus 20 of FIG. 4 is that the LED panel does not have the non-pattern area NDA, and the configuration of the second protrusion structure is different. In the present embodiment, the second protrusion structure 122 does not have a protrusion portion, and the display edge (for example, the first display edge DAs1 and the second display edge DAs2) of the LED panel (for example, the first LED panel 111B to the fourth LED panel 114B) may be aligned with the edge (or the substrate edge 101e of the substrate 101) of the joint structure 150 in the normal direction of the substrate 101. Therefore, in the first direction D1, the second width W2 of the tiling pixel area TPA1 provided with the tiling pixel TPX1A (or the two second pixels PX2A) may be smaller than the first width W1 of the main pixel area MPA provided with the first pixel PX1. Similarly, in the second direction D2, the fourth width W4 of the tiling pixel area TPA1 provided with the tiling pixel TPX2A (or the two second pixels PX2A) may be smaller than the third width W3 of the main pixel area MPA provided with the first pixel PX1.

On the other hand, the first pixel PX1 has a first distance S1 in the first direction D1 between the two light-emitting elements (for example, the two first light-emitting elements LED1) arranged in the first direction D1, the tiling pixel TPX1A has a second distance S2 in the first direction D1 between the two light-emitting elements (for example, the two first light-emitting elements LED1) arranged in the first direction D1, and the second distance S2 is smaller than the first distance S1. Similarly, the first pixel PX1 has a third distance S3 in the second direction D2 between the two light-emitting elements (for example, the first light-emitting element LED1 and the second light-emitting element LED2) arranged in the second direction D2, the tiling pixel TPX1A overlapping with the second display edge DAs2 has a fourth distance S4 in the second direction D2 between the two light-emitting elements (for example, the two first light-emitting elements LED1) arranged in the second direction D2, and the fourth distance S4 is smaller than the third distance S3. In this manner, the visibility of the tiling area (i.e., where the joint structure 150 is located) between the four LED panels can be reduced, which helps to improve the overall light uniformity of the tiling display apparatus 10, thereby effectively suppressing the image discontinuity generated on the display frame by the tiling area of the four LED panels.

Figure 6:
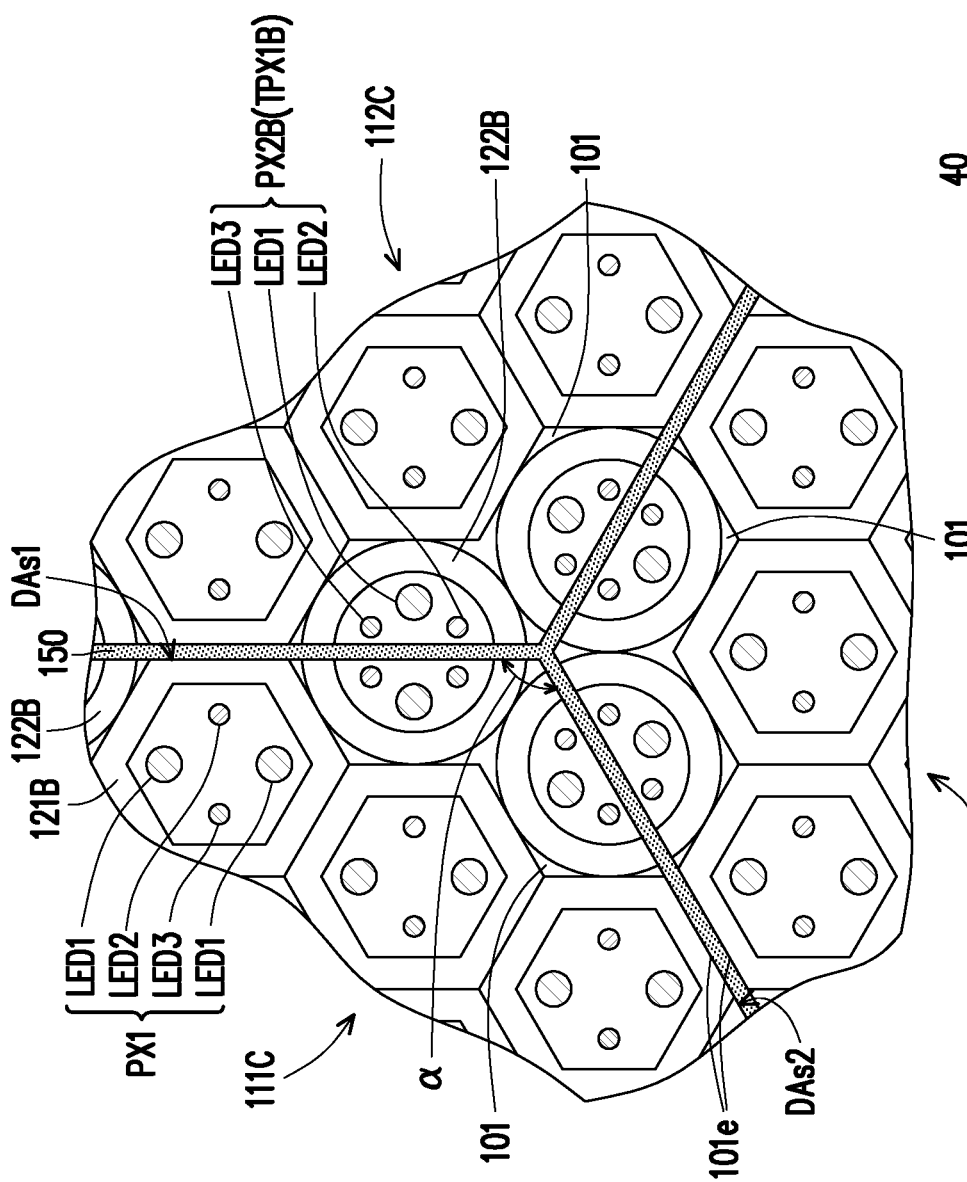
FIG. 6 is a schematic top view of a tiling display apparatus according to a fourth embodiment of the present disclosure.

FIG. 6 is a schematic top view of a tiling display apparatus according to a fourth embodiment of the present disclosure. Referring to FIG. 6, the main difference between the tiling display apparatus 40 of the present embodiment and the tiling display apparatus 30 of FIG. 5 is that the configurations of the first protrusion structure and the second protrusion structure are different and the tiling display apparatus 40 does not have the third pixel PX3. In detail, an angle α larger than 90 degrees is formed between the first display edge DAs1 and the second display edge DAs2 of the LED panel (for example, the first LED panel 111C to the third LED panel 113C) of the tiling display apparatus 40, and the angle α is, for example, 120 degrees. In this embodiment, the outer contour of the LED panel may be a regular hexagon, but the disclosure is not limited thereto. In this embodiment, the number of light-emitting elements of the tiling pixel TPX1B may be selectively greater than the number of light-emitting elements of the first pixel PX1, but the disclosure is not limited thereto.

In the present embodiment, the orthogonal projection of the first protrusion structure 121B on the substrate 101 exhibits an outer contour in the shape of a regular hexagon. That is, the plurality of first protrusion structures 121B of each of the first LED panel 111C, the second LED panel 112C, and the third LED panel 113C may be arranged on the substrate 101 in the most closely stacked pattern (for example, a hive shape), thereby reducing the number of tiling pixels of the tiling display apparatus 40. On the other hand, the orthogonal projection of the second protrusion structure 122B on the substrate 101 exhibits a semicircular outer contour. That is, the orthogonal projection of the two second protrusion structures 122B disposed on opposite sides of any of the tiling pixels TPX1B (or the two second pixels PX2B) on the substrate 101 exhibits a circular outer contour. In this manner, the light patterns of the six light-emitting elements of the tiling pixel TPX1B can be changed to improve the light uniformity of the tiling display apparatus 40 in the tiling area (i.e., where the joint structure 150 is located).

Figure 7:
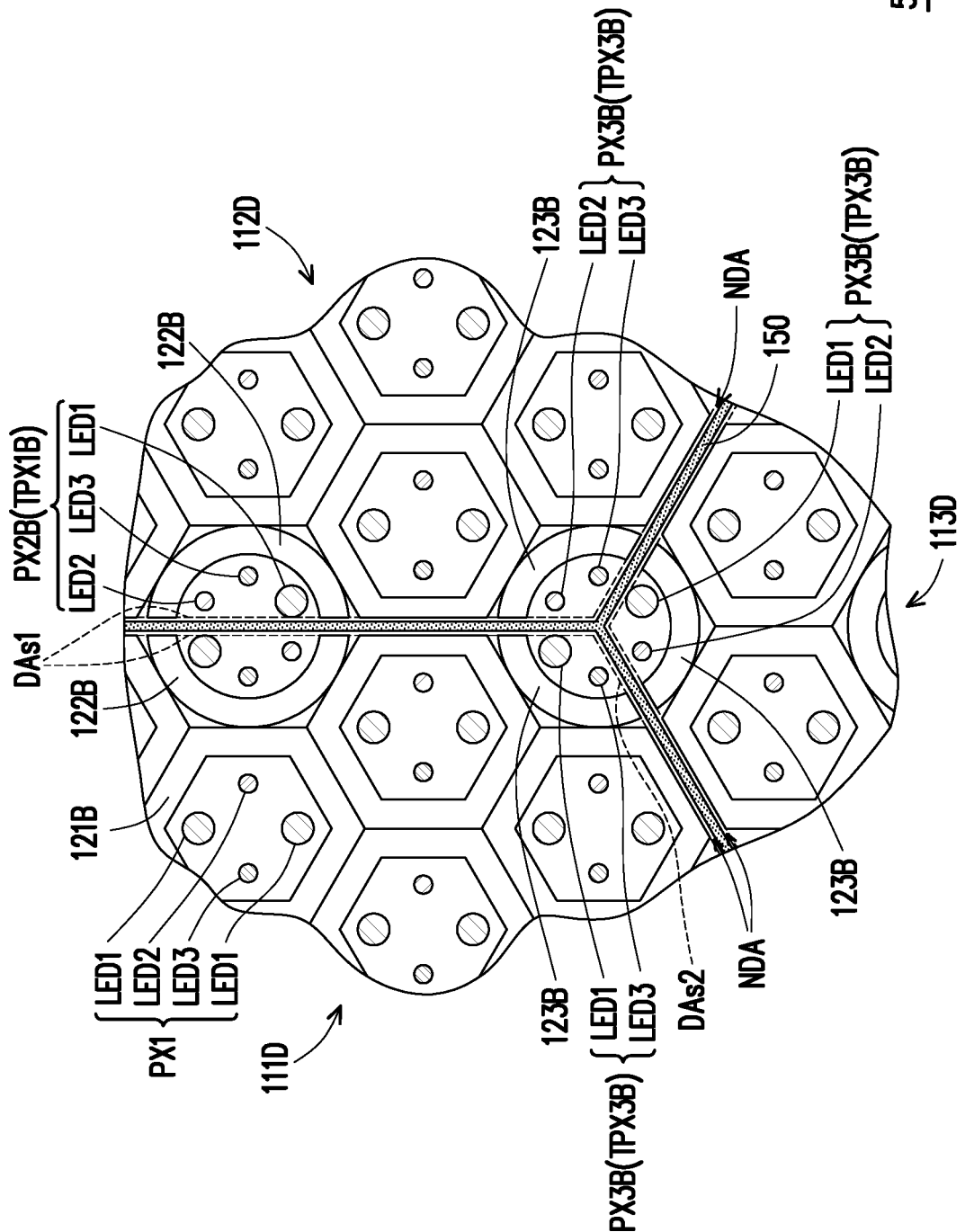
FIG. 7 is a schematic top view of a tiling display apparatus according to a fifth embodiment of the present disclosure.

FIG. 7 is a schematic top view of a tiling display apparatus according to a fifth embodiment of the present disclosure. Referring to FIG. 7, the main difference between the tiling display apparatus 50 of the present embodiment and the tiling display apparatus 40 of FIG. 6 is that the first LED panel 111D, the second LED panel 112D, and the third LED panel 113D each has a non-pattern area NDA, a third pixel PX3B, and a third protrusion structure 123B.

In this embodiment, the third pixel PX3B of the LED panel (for example, the first LED panel 111D) is located at the boundary between the first display edge DAs1 and the second display edge DAs2, and the number of the light-emitting elements thereof can be two. For example, the two light-emitting elements of the third pixel PX3B of the first LED panel 111D are the first light-emitting element LED1 and the third light-emitting element LED3, respectively, the two light-emitting elements of the third pixel PX3B of the second LED panel 112D are the second light-emitting element LED2 and the third light-emitting element LED3, respectively, and the two light-emitting elements of the third pixel PX3B of the third LED panel 113D are the first light-emitting element LED1 and the second light-emitting element LED2, respectively. In this embodiment, the number of light-emitting elements of the tiling pixel TPX3B may be selectively greater than the number of light-emitting elements of the first pixel PX1, but the disclosure is not limited thereto.

Further, the third protrusion structure 123B of the LED panel (for example, the first LED panel 111D) may extend from the first display edge DAs1 to the second display edge DAs2, and the two light-emitting elements of the third pixel PX3B are located between the third protrusion structure 123B and the display edge. Specifically, the orthogonal projections of the three third protrusion structures 123B of the first LED panel 111D, the second LED panel 112D, and the third LED panel 113D on the substrate 101 can exhibit a circular outer contour. In this manner, the light patterns of the six light-emitting elements of the tiling pixel TPX3B (or the three third pixels PX3B) can be adjusted to enhance the light uniformity of the tiling display apparatus 50 in the tiling area (i.e., where the joint structure 150 is located) and the non-pattern area NDA.

Figure 8:
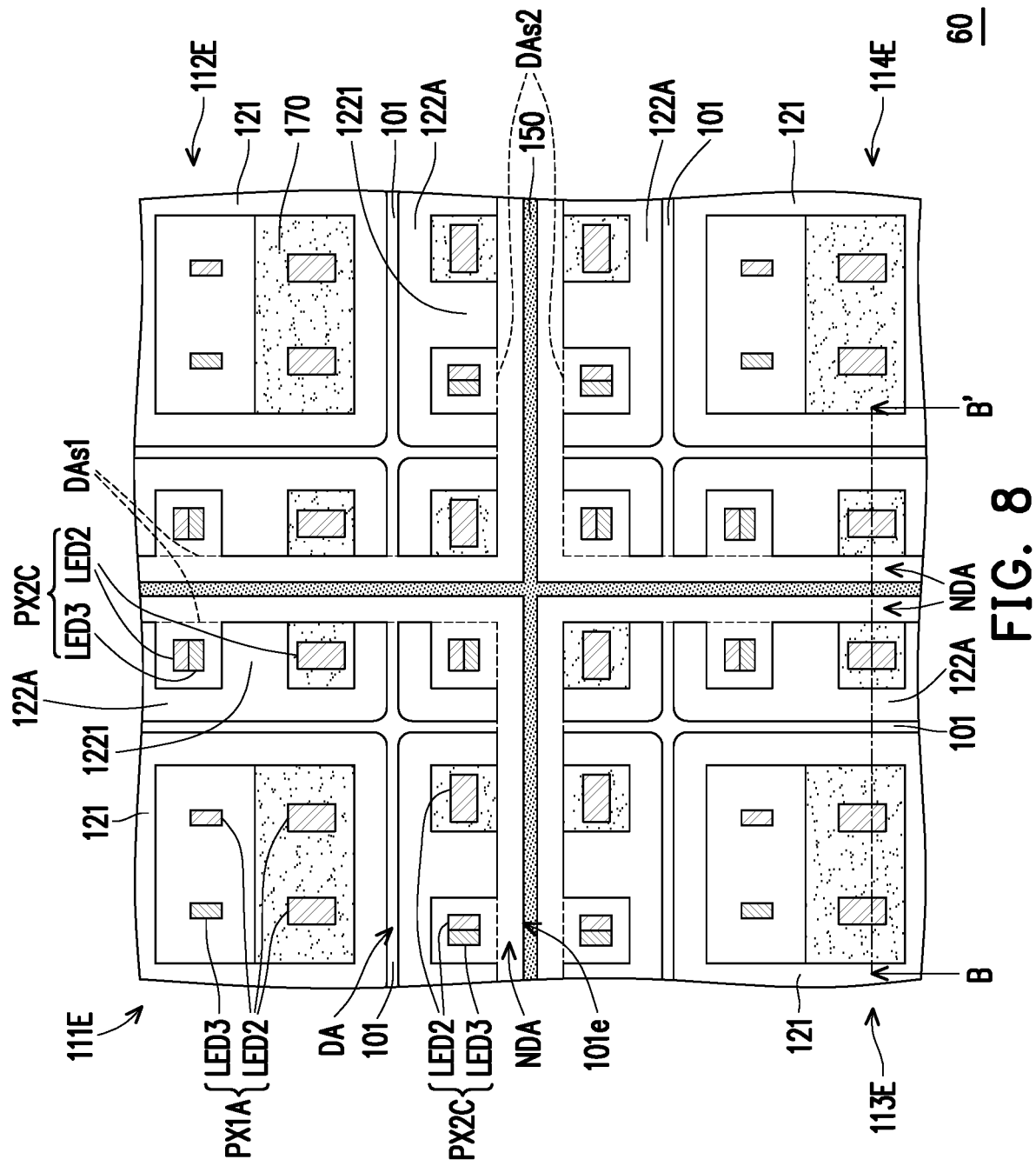
FIG. 8 is a schematic top view of a tiling display apparatus according to a sixth embodiment of the present disclosure.
Figure 9:
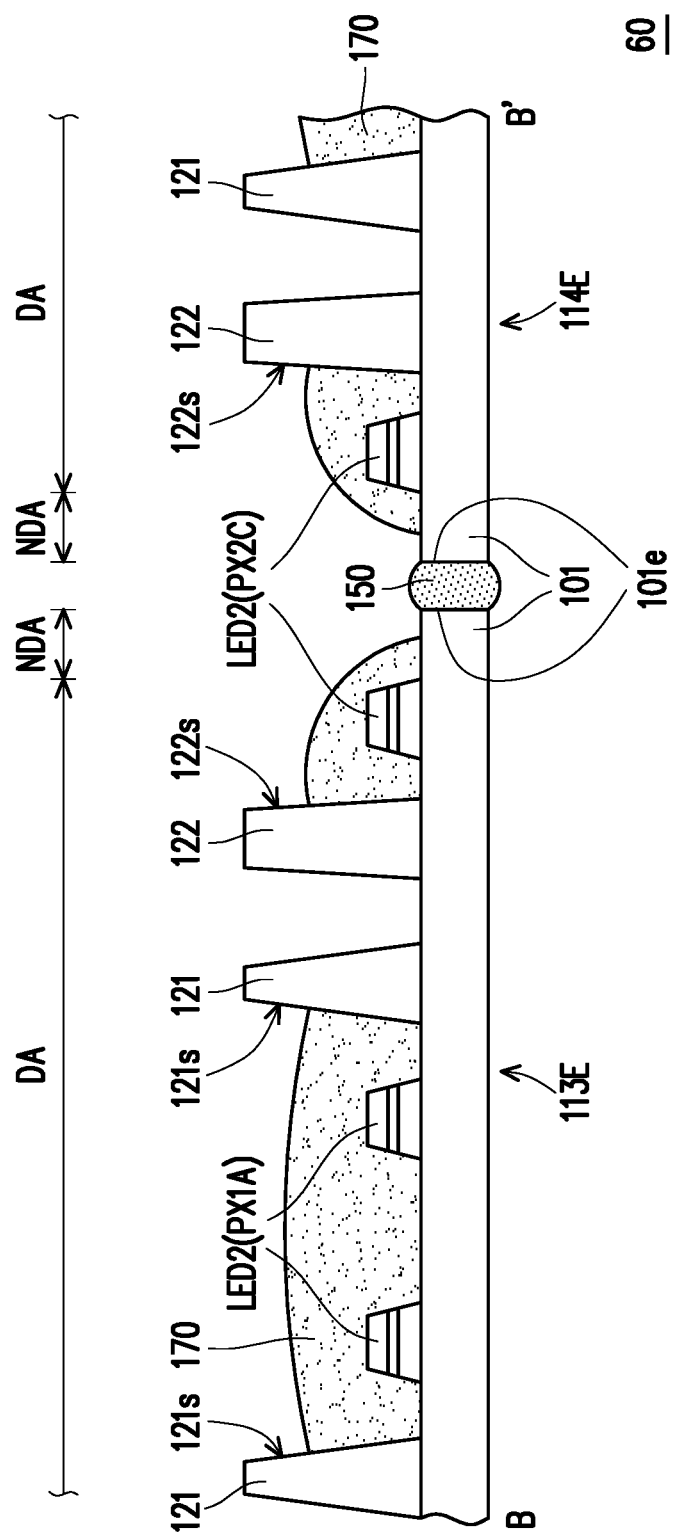
FIG. 9 is a schematic cross-sectional view of the tiling display apparatus of FIG. 8.

FIG. 8 is a schematic top view of a tiling display apparatus according to a sixth embodiment of the present disclosure. FIG. 9 is a schematic cross-sectional view of the tiling display apparatus of FIG. 8. Specifically, FIG. 9 corresponds to the cross-sectional line B-B' of FIG. 8. Referring to FIG. 8 and FIG. 9, the main difference between the tiling display apparatus 60 of the present embodiment and the tiling display apparatus 20 of FIG. 4 is that the LED panel of the tiling display apparatus 60 is further provided with a wavelength conversion layer 170 and the type of light-emitting elements. In detail, the four light-emitting elements of the first pixel PX1A of the LED panel (for example, the first LED panel 111E to the fourth LED panel 114E) are three second light-emitting elements LED2 and one third light-emitting element LED3, respectively, and the three light-emitting elements of the second pixel PX2C are two second light-emitting elements LED2 and one third light-emitting element LED3, respectively.

In this embodiment, the wavelength conversion layer 170 may cover the two second light-emitting elements LED2 of the first pixel PX1A and the one second light-emitting element LED2 of the second pixel PX2C, and is configured to convert the luminous color (or beam wavelength) of the covered second light-emitting element LED2 into another luminous color (or another beam wavelength). The converted luminous color is different from the luminous color of the second light-emitting element LED2 and the luminous color of the third light-emitting element LED3. That is, the cooperation of the wavelength conversion layer 170 and the second light-emitting element LED2 can be used to replace the first light-emitting element LED1 of FIG. 4. For example, the luminous colors of the second light-emitting element LED2, the third light-emitting element LED3 and the first light-emitting element LED1 of FIG. 4 are blue, green and red, respectively, and the wavelength conversion layer 170 can be used to convert the luminous color (i.e., blue) of the second light-emitting element LED2 into red, thereby enhancing the luminous efficiency of red light of the pixel. In this embodiment, the material of the wavelength conversion layer 170 may include a quantum dot and a photoluminescence phosphor material.

It is worth mentioning that, as shown in FIG. 9, the first protrusion structure 121 has a first side surface 121s facing the second light-emitting element LED2 of the first pixel PX1A, and the second protrusion structure 122 has a second side surface 122s facing the second light-emitting element LED2 of the second pixel PX2C, and the wavelength conversion layer 170 further covers at least a portion of the first side surface 121s of the first protrusion structure 121 and at least a portion of the second side surface 122s of the second protrusion structure 122. In other words, the protrusion structure of the LED panel also has the function of supporting the wavelength conversion layer 170.

In summary, in the LED panel of an embodiment of the present disclosure, a plurality of second pixels are disposed between the display edge on at least one side for splicing and the plurality of first pixels, and the peripheries of each of the first pixels and each of the second pixels are respectively provided with two protrusion structures, and the two protrusion structures respectively have different orthogonal projection contours on the substrate, which can reduce the visibility of the non-pattern area of the LED panel. In addition, in the tiling display apparatus in an embodiment of the present disclosure, by splicing together the two display edges having the plurality of second pixels of each of the two LED panels and constituting the plurality of tiling pixels, and the tiling pixels are respectively disposed between two corresponding second protrusion structures, it is possible to enhance the overall light uniformity of the tiling display apparatus, thereby effectively suppressing the image discontinuity generated on the display frame by the tiling area of the two LED panels.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting diode (LED) panel comprising:
   a substrate having a display area and a substrate edge;
   a plurality of first pixels and a plurality of second pixels disposed in the display area, and each has at least one light-emitting element, wherein the second pixels are located on at least one display edge of the display area, and the second pixels are located between the first pixels and the substrate edge; and
   a plurality of first protrusion structures and a plurality of second protrusion structures disposed on the substrate, each of the first protrusion structures being located at a periphery of the at least one light-emitting element of one corresponding first pixel, each of the second protrusion structures being located at a periphery of the at least one light-emitting element of one corresponding second pixel, wherein the at least one light-emitting element of each of the second pixels is located between one corresponding second protrusion structure and one corresponding display edge, and an orthogonal projection contour of each of the first protrusion structures on the substrate is different from an orthogonal projection contour of each of the second protrusion structures on the substrate.

2. The LED panel of claim 1, wherein the orthogonal projection contour of each of the second protrusion structures on the substrate has an opening facing one corresponding display edge.

3. The LED panel of claim 1, wherein each of the first protrusion structures has a first side surface facing the at least one light-emitting element of one corresponding first pixel, each of the second protrusion structures has a second side surface facing the at least one light-emitting element of one corresponding second pixel, wherein each of the first protrusion structures has a first inner angle between the first side surface and a surface of the substrate, and each of the second protrusion structures has a second inner angle between the second side surface and the surface of the substrate, and the second inner angle is larger than the first inner angle.

4. The LED panel of claim 1, wherein the shortest distance between the at least one light-emitting element of each of the second pixels and one corresponding second protrusion structure is smaller than the shortest distance between the at least one light-emitting element of each of the first pixels and one corresponding first protrusion structure.

5. The LED panel of claim 1, wherein the number of the at least one light-emitting element of each of the first pixels is greater than a number of the at least one light-emitting element of each of the second pixels.

6. The LED panel of claim 1, wherein the at least one light-emitting element of each of the first pixels is a plurality of first light-emitting elements and a second light-emitting element, and a luminous color of the plurality of first light-emitting elements is different from a luminous color of the second light-emitting element.

7. The LED panel of claim 6, wherein the luminous color of the plurality of first light-emitting elements is green or red.

8. The LED panel of claim 1, wherein the at least one light-emitting element of each of the second pixels is two light-emitting elements, and each of the second protrusion structures has a protrusion portion, and the protrusion portion of each of the second protrusion structures is located between the two light-emitting elements of one corresponding second pixel.

9. The LED panel of claim 1, further comprising:
   a third pixel disposed in the display area, and the first pixels, the second pixels, and the third pixel each has at least one light-emitting element, wherein the at least one display edge is a first display edge and a second display edge intersecting each other, and the third pixel is located at a boundary between the first display edge and the second display edge; and
   a third protrusion structure disposed on the substrate, the third protrusion structure being located at a periphery of the at least one light-emitting element of the third pixel, wherein the at least one light-emitting element of the third pixel is located between the first display edge, the second display edge and the third protrusion structure, and an orthogonal projection contour of the third protrusion structure on the substrate is different from the orthogonal projection contours of each of the first protrusion structures and the second protrusion structures on the substrate.

10. The LED panel of claim 9, wherein the orthogonal projection contour of the third protrusion structure on the substrate has an opening facing the first display edge and the second display edge.

11. The LED panel of claim 1, further comprising a wavelength conversion layer covering at least a portion of the light-emitting elements of the first pixels and the second pixels, wherein each of the first protrusion structures has a first side surface facing the at least one light-emitting element of one corresponding first pixel, each of the second protrusion structures has a second side surface facing the at least one light-emitting element of one corresponding second pixel, and the wavelength conversion layer further covers at least a portion of the first side surface of each of the first protrusion structures and at least a portion of the second side surface of each of the second protrusion structures.

12. The LED panel of claim 1, wherein a luminous brightness of the light-emitting element of each of the second pixels is greater than a luminous brightness of the light-emitting element of each of the first pixels.

13. The LED panel of claim 1, wherein a visible light reflective index of each of the first protrusion structures and the second protrusion structures is greater than or equal to 50%.

14. A tiling display apparatus, comprising:
a first LED panel and a second LED panel, each of the first LED panel and the second LED panel comprising:
a substrate having a display area;
a plurality of first pixels and a plurality of second pixels disposed in the display area, and each has at least one light-emitting element, wherein the second pixels are located at a display edge of the display area, and the first pixels are located on one side of the second pixels away from the display edge; and
a plurality of first protrusion structures and a plurality of second protrusion structures disposed on the substrate, each of the first protrusion structures being located at a periphery of the at least one light-emitting element of one corresponding first pixel, each of the second protrusion structures being located at a periphery of the at least one light-emitting element of one corresponding second pixel, wherein the at least one light-emitting element of each of the second pixels is located between one corresponding second protrusion structure and the display edge, and an orthogonal projection contour of each of the first protrusion structures on the substrate is different from an orthogonal projection contour of each of the second protrusion structures on the substrate,
wherein the display edge of the first LED panel is spliced to the display edge of the second LED panel in a first direction, and the second pixels of the first LED panel respectively constitute a plurality of tiling pixels together with the second pixels of the second LED panel, and at least two light-emitting elements of each of the tiling pixels are located between one corresponding second protrusion structure of the first LED panel and one corresponding second protrusion structure of the second LED panel.

15. The tiling display apparatus of claim 14, further comprising:
a joint structure connecting the first LED panel and the second LED panel, and the joint structure being located between the second pixels of the first LED panel and the second pixels of the second LED panel.

16. The tiling display apparatus of claim 14, wherein the orthogonal projection contour of each of the second protrusion structures of the first LED panel on the substrate has an opening facing the display edge of the first LED panel, the orthogonal projection contour of each of the second protrusion structures of the second LED panel on the substrate has an opening facing the display edge of the second LED panel, and the openings of the second protrusion structures of the first LED panel are respectively disposed opposite to the openings of the second protrusion structures of the second LED panel.

17. The tiling display apparatus of claim 14, wherein a number of the at least two light-emitting elements of each of the tiling pixels is greater than or equal to a number of the at least one light-emitting element of each of the first pixels.

18. The tiling display apparatus of claim 14, wherein a number of the at least one light-emitting element of each of the first pixels and a number of the at least two light-emitting elements of each of the tiling pixels are even numbers.

19. The tiling display apparatus of claim 14, wherein the first protrusion structures of the first LED panel and the second LED panel define a plurality of main pixel areas, the second protrusion structures of the first LED panel and the second LED panel define a plurality of tiling pixel areas, and the main pixel areas are respectively provided with the first pixels of the first LED panel and the second LED panel, and the tiling pixel areas are respectively provided with the tiling pixels,
wherein each of the main pixel areas has a first width in the first direction, each of the tiling pixel areas has a second width in the first direction, and the second width is smaller than or equal to the first width.

20. The tiling display apparatus of claim 14, wherein the at least one light-emitting element of each of the first pixels is two light-emitting elements arranged along the first direction, and the at least two light-emitting elements of each of the tiling pixels are two light-emitting elements arranged along the first direction, and there is a first distance between the two light-emitting elements of each of the first pixels in the first direction, and there is a second distance between the two light-emitting elements of each of the tiling pixels in the first direction, and the second distance is smaller than the first distance.

* * * * *